April 30, 1963 R. P. CLAGETT 3,087,239

METHODS OF BONDING LEADS TO SEMICONDUCTIVE DEVICES

Filed June 19, 1959 3 Sheets-Sheet 1

INVENTOR
R. P. CLAGETT

BY Albert R. Hodges

ATTORNEY

April 30, 1963 R. P. CLAGETT 3,087,239

METHODS OF BONDING LEADS TO SEMICONDUCTIVE DEVICES

Filed June 19, 1959 3 Sheets-Sheet 2

INVENTOR
R. P. CLAGETT
BY Albert R. Hodges
ATTORNEY

April 30, 1963 R. P. CLAGETT 3,087,239

METHODS OF BONDING LEADS TO SEMICONDUCTIVE DEVICES

Filed June 19, 1959 3 Sheets-Sheet 3

INVENTOR
R. P. CLAGETT
BY
Albert R. Hodges
ATTORNEY

United States Patent Office 3,087,239

Patented Apr. 30, 1963

3,087,239

METHODS OF BONDING LEADS TO SEMICONDUCTIVE DEVICES

Robert P. Clagett, Yardley, Pa., assignor to Western Electric Company, Incorporated, New York, N.Y., a corporation of New York Filed June 19, 1959, Ser. No. 821,444

8 Claims. (Cl. 29—471.1)

This invention relates to methods of bonding leads to semiconductive devices, and more particularly to such methods in which compression bonding techniques are utilized.

The small size of semiconductive devices has complicated the task of completely mechanizing their production. To date, the manufacture of transistors, for example, is interrupted by a number of laborious manual steps. A particular difficulty lies in the bonding of conductive leads, which are often finer than a human hair, to semiconductive devices. In the prior art, the handling of these leads required meticulous and time-consuming care. Much of the difficulty arose from the lack of continuous control over each individual lead employed. Thus, for each bond made, an operator had to search for and reassert control over an unsupported end of a tiny individual lead. This not only resulted in wasted motion and loss of time but, more important, it rendered impossible the mechanization of the bonding operation.

An object of the invention is to provide new and improved methods of bonding leads to semiconductive devices.

A further object of the invention is to provide new and improved methods utilizing compression bonding techniques for bonding leads to semiconductive devices.

Another object of the invention is to provide new and improved methods of bonding leads to semiconductive devices wherein control over the leads is continuously exercised.

A method illustrating certain aspects of the invention may include feeding a wire-like member through a tube until a portion of the member protrudes, orienting the protruding portion of the member between an edge of the tube and a part to which the member is to be bonded, and pressing the protruding portion of the member against the part by means of the tube edge to form a bond between the member and the part.

A complete understanding of the invention may be obtained from the following detailed description of a method and means forming specific embodiments thereof, when read in conjunction with the appended drawings, in which.

Relative dimensions in the figures have often been distorted in order to illustrate the invention more clearly.

Figure 1A:
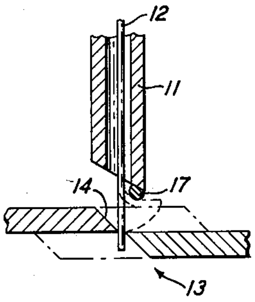
FIGS. 1A and 1B are cross-sectional views and FIGS. 1C and 1D are elevations illustrating succeeding steps in a method forming one embodiment of the invention.

FIGS. 1A–1D illustrate the invention as applied in the bonding of conductive leads to a semiconductive device such as a transistor 10. Referring first to FIG. 1A, this embodiment utilizes a rigid tube 11 which may have an inside diameter of 4 mils. A gold, wire-like conductive lead 12 having a diameter of 1 mil, for example, is fed through the tube until a portion of the lead protrudes. The protruding portion is then oriented between an edge of tube 11 and the part to which the lead is to be bonded.

Lead 12 is fed continuously into and through tube 11 in order to avoid the difficulty of dealing with individual lengths of lead. Accordingly, means are provided for cutting the lead when required. A particular advantage, later described, is derived from combining this cutting step with the above-indicated orienting step. Such combination is effected by means of a scissor-like shearing device 13. Shearing device 13 has a beveled cutting edge 14 arranged with its beveled portion facing the tube edge. Thus, with a shearing motion of device 13 transverse to the axis of tube 11, the protruding portion of lead 12 is bent relative to the tube axis at an angle of approximately 90 degrees. In this way, shearing and proper orientation of the conductive lead are accomplished in a single step. The shearing may be effected at any desired position along the protruding portion of lead 12 by selective positioning of cutting edge 14 relative to the tube edge.

Figure 1B:
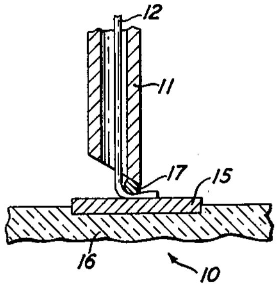

The next step in forming the bond is illustrated in FIG. 1B. Only that part of transistor 10 to which lead 12 is to be bonded is shown. In this embodiment, the lead is bonded to an aluminum stripe 15 attached to a semiconductive body 16. Alternatively, the lead may be bonded directly to the semiconductive body. To form the bond, transistor 10 is heated. The protruding portion of lead 12 is then pressed against aluminum stripe 15 with the edge of tube 11. In this way, a firm thermo-compression bond is formed between lead 12 and stripe 15. Typically, transistor 10 is heated to a temperature of approximately 325 degrees C., which is well below the melting point of any of the elements involved, while a pressure of approximately 20,000 pounds per square inch is applied to lead 12. To more readily apply such pressure, the tube edge may advantageously be provided with a tungsten tip 17. Furthermore, the edge of tube 11 is preferably slanted away from tip 17 so as to provide adequate clearance.

It should be noted that the invention is not limited to the forming of thermo-compression bonds only. For example, mechanical vibrations at ultrasonic frequencies may be utilized as a bonding aid in place of the heat employed in the instant embodiment.

Figure 1C:
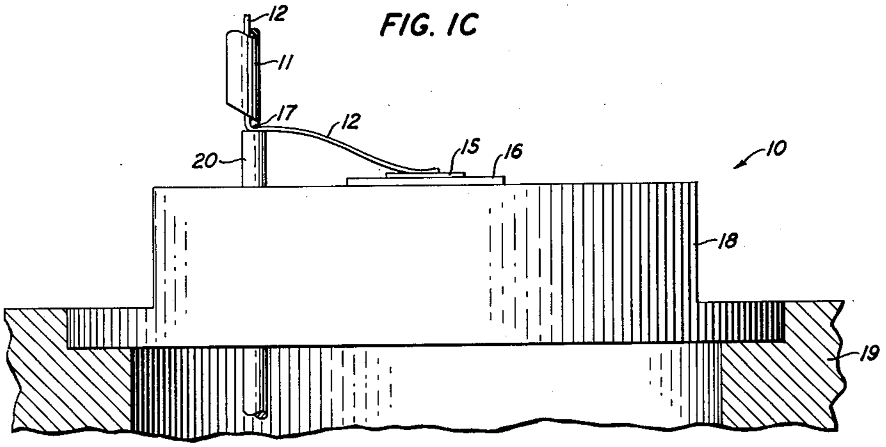

FIG. 1C illustrates a means for restraining transistor 10 during the bonding operation. The transistor ordinarily comprises a base portion 18 to which semiconductive body 16 is attached. Thus, base portion 18 may advantageously be seated in an accommodating well 19 which is further adapted to apply heat through the base portion to the bonding region.

Semiconductive body 16 normally takes the form of a wafer approximately 3 mils thick. In FIG. 1C, conductive lead 12 is shown as having already been bonded to metallic stripe 15 in wafer 16 as a result of the steps illustrated in FIGS. 1A and 1B. The next step is to electrically connect metallic stripe 15 to its terminal 20. To this end, tube 11 is moved from a position above the metallic stripe to one above the terminal. This movement automatically draws lead 12 through the tube. The tube edge or tip 17 is then pressed against lead 12 to form a thermo-compression bond to terminal 20.

Figure 1D:
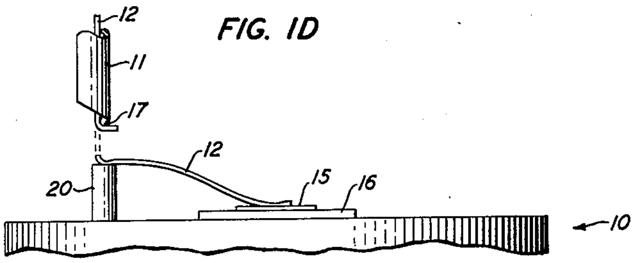

After completing the bond to terminal 20, tube 11 is moved away from the terminal area a distance just sufficient to permit shearing device 13 (FIG. 1A) to shear and bend conductive lead 12, as shown in FIG. 1D. Thus, the connection of metallic stripe 15 to its terminal 20 is effected in a simple and rapid operation during which lead 12 is never left unsupported and control over the lead is never relinquished. Furthermore, the combined shearing and bending step automatically prepares the device for subsequent bonding operations. Bonding methods utilized in the prior art have required an average of forty-four separate motions for each three-terminal transistor. The present invention reduces the number of motions required to twelve.

Other means for shearing lead 12 may be utilized. For example, referring to FIG. 1C, pressure greater than that required to provide a bond may be applied by tip 17 thereby to bond and break through the lead in one step. Shearing device 13 is preferred, however, because it combines the shearing and orienting steps.

Figure 2:
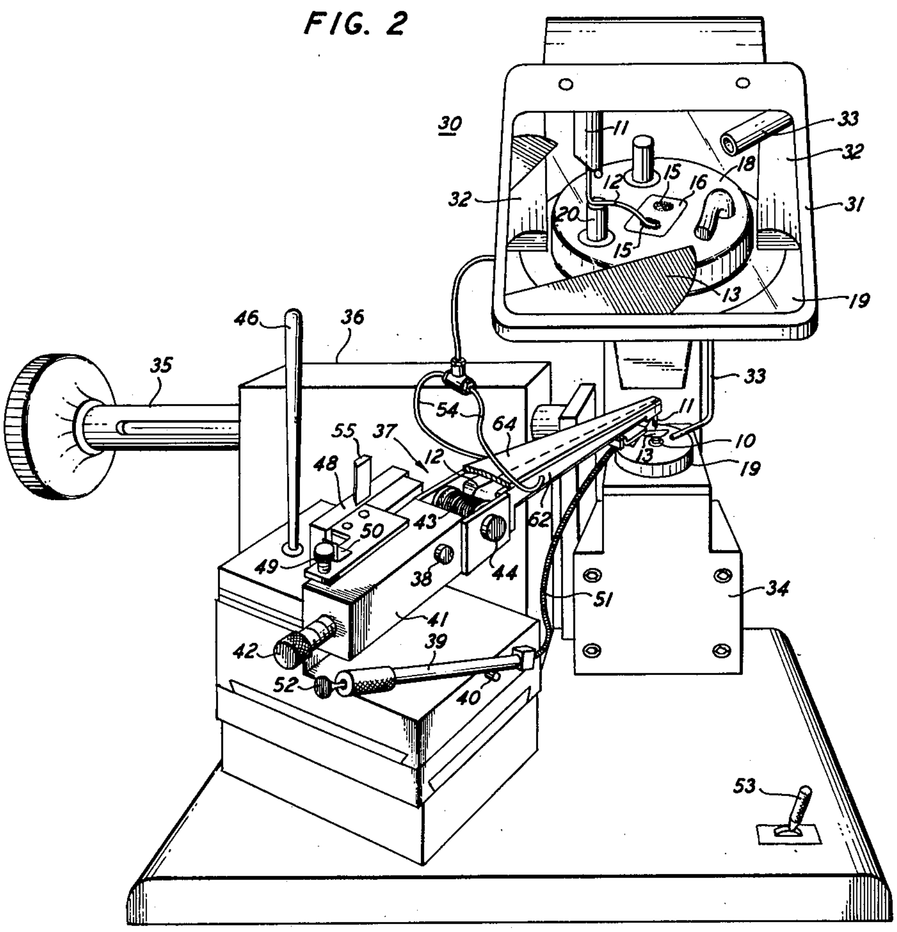
FIG. 2 is a perspective view of a bonding apparatus forming one embodiment of the invention.

FIG. 2 illustrates an apparatus 30 which may be used to effect the bonding steps illustrated in FIGS. 1A–1D. Manually operated apparatus is shown in order to simplify the description. The bonding methods of the invention, however, readily lend themselves to completely mechanized operation.

Apparatus 30 is provided with a viewing screen 31 which presents a magnified image of the working area to an operator. In the viewing screen, the operator sees base portion 18 of transistor 10 seated in heating well 19. If base portion 18 is flanged, clamps 32 are advantageously provided to hold the transistor in place. The enlarged perspective view of wafer 16 (normally a 30 x 30 mil square) shows two metallic stripes 15 attached thereto. In the illustrated view, the operator has just completed the bonding operation to terminal 20 and is preparing to shear conductive lead 12 with shearing device 13. A tube 33 is employed to envelop the working area with an inert gas in order to prevent oxidation.

Well 19 is actually a replaceable unit seated within an electrical heating unit 34. In this way, different wells may be substituted to accommodate different transistor shapes. Heating unit 34 is supported by an arm 35 which is frictionally engaged by a block 36. Arm 35 may be either rotated or longitudinally translated so as to remove well 19 from the congested working area to facilitate transistor removal and replacement.

Figure 3:
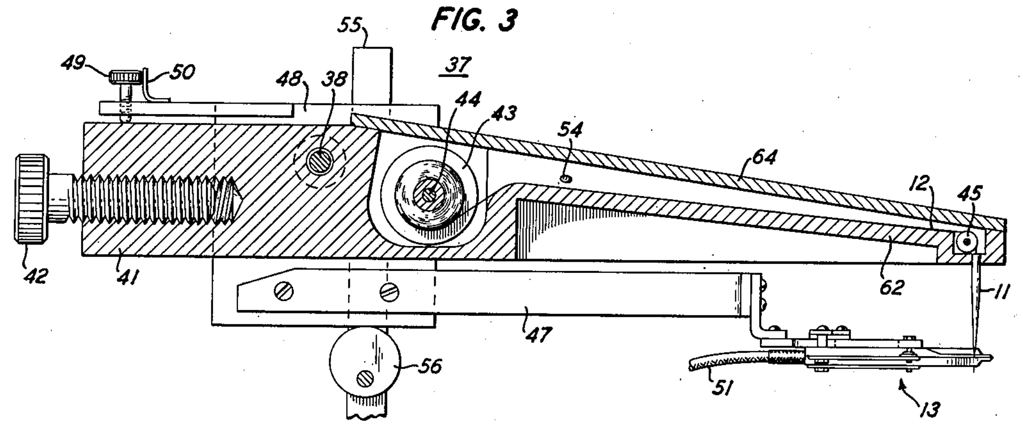
FIG. 3 is an elevation, partly in longitudinal cross-section, of a bonding tool forming part of the apparatus of FIG. 2.
Figure 4:
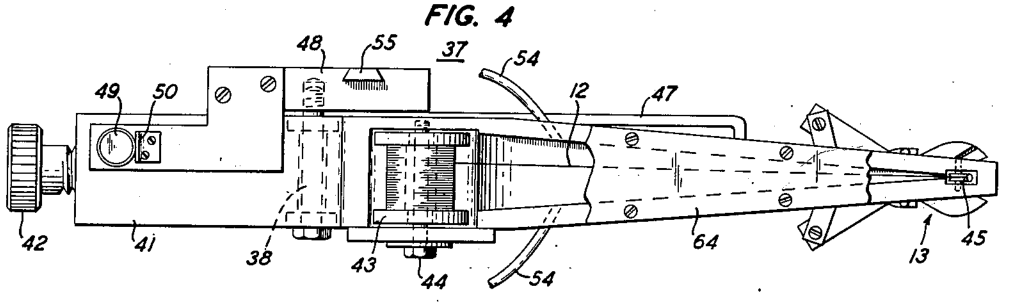
FIG. 4 is a plan view of the bonding tool of FIG. 3.

Tube 11 is advantageously mounted on an arm shown generally at 37 and in greater detail in FIGS. 3 and 4. Arm 37 is weighted to rotate clockwise about pivot 38 attached to a stand 48. A set screw 49 passing through an extension of stand 48 restrains arm 37 at a preselected angular position. Ball bearings are preferably employed in the pivot in order to minimize friction. Tube 11 is situated at one extreme of the arm with its axis transversely disposed relative to the axis of the arm. Means are provided for moving pivot 38 relative to transistor 10 in order to bring tube 11 into bonding position. A handle 39 is provided for this purpose. Handle 39 is swingable in a vertical plane, its motion being translated through an eccentric cam 56 (FIG. 3) into up or down movement of stand 48 along a vertical shaft 55.

To form the thermo-compression bond, the edge of tube 11 is brought to bear against lead 12 on terminal 20 by downward motion of pivot 38. Continuation of this downward motion tends to pivot arm 37 counter-clockwise about pivot 38. This tendency, however, is resisted by the weight of the arm, so that a substantially constant pressure is applied to lead 12 throughout the downward motion of pivot 38. A stop 40 for handle 39 is provided to automatically halt downward movement of pivot 38 at a preselected position. The amount of pressure applied may be adjusted by the provision of a counterweight 41 having a movable portion, in this case a screw 42, for shifting the center of gravity of the weight relative to pivot 38.

It is, of course, possible to provide other means for applying a constant pressure to lead 12. For example, tube 11 may be biased with a spring which applies a constant reverse pressure as the tube edge is brought to bear against the lead.

Arm 37 also provides support for a spool of conductive lead 43 rotatably mounted on an axis 44. The spool holds a suitable supply of the conductive lead. Thus, in moving tube 11 from one bonding position to another, conductive lead 12 is reeled off spool 43 as desired. Advantageously, precise horizontal positioning of arm 37 is provided by manipulation of a joystick 46 through a control system which may, for example, be of the type described in an article by W. L. Bond entitled "Micromanipulators" and published in the 1956 Bell Laboratories Record, vol. 34, pages 90–92.

Lead 12 is preferably guided by a pulley 45 in order to prevent binding. If binding does take place, however, pressurized gas may be applied to dislodge the lead. The gas should be applied in short bursts, as by a rapid flick of a toggle switch 53. Furthermore, the gas should be applied equally to either side of lead 12 to prevent lateral displacement of the lead. To this end, two gas conduits 54 connected to opposite sides of arm 37, respectively, may be utilized.

Shearing device 13 is advantageously mounted on an extension member 47 attached to stand 48. Adjustable vertical positioning of the shearing device relative to the edge of tube 11 in order to control the position along lead 12 at which shearing is to take place may then be effected by means of set screw 49. A spring 50 is provided to maintain the set screw in a selected position.

In the apparatus shown, scissor-like shearing device 13 is operated through a flexible coupling 51. This permits the operation of the shearing device to be effected remotely, for example, through a push button 52 placed on handle 39. An operator may thereby effect all the operations required for bonding leads to a transistor through the medium of joystick 46 and handle 39. With the apparatus described, an operator may readily produce 150 units per hour as compared to the prior-art rate of approximately 15 units per hour. Complete mechanization would undoubtedly increase this figure markedly.

Figure 5:
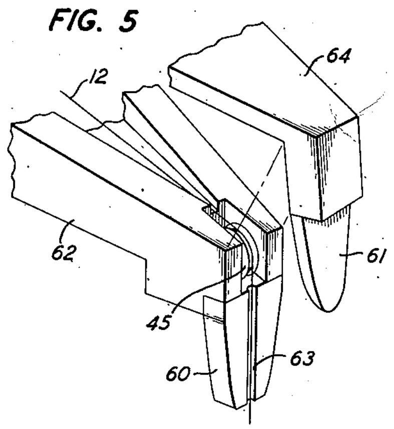
FIGS. 5 and 6 are perspective views illustrating an alternative tube arrangement which may be employed with the bonding tool of FIGS. 3 and 4.
Figure 6:
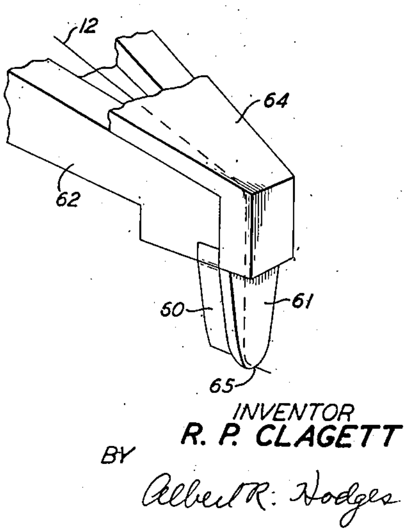

The tube arrangement illustrated in FIGS. 5 and 6 may be used with arm 37 of FIGS. 3 and 4 in place of tube 11. In such an arrangement, a tube is formed of separable parts 60 and 61. Part 60 is attached to a base portion 62 of arm 37 and has a channel 63 therein for lead 12. Part 61 is attached to a cover portion 64 of arm 37 so as to be removable with the cover. The cover may be hinged or otherwise suitably attached to the base portion. This considerably eases the task of initial set-up since the threading of lead 12 through a one-piece tube is eliminated. The attachment of cover 64 to base 62 automatically brings part 61 into its proper position relative to part 60 to form a tube enclosing lead 12. Part 61 can be made of carbide, for example, and has a rounded nose 65 which extends below part 60 for the application of bonding pressure.

Though particularly useful in the semiconductor industry, the present invention is broadly applicable to the bonding of wire-like members to preselected parts in general.

It is to be understood that the described methods and means are simply illustrative of the application of the principles of the invention. Numerous other methods and means may be devised by those skilled in the art which will embody the principles of the invention and fall within the spirit and scope thereof.

What is claimed is:

1. The method of bonding a wire-like member to a preselected part, which comprises feeding said member through a tube until a portion of said member protrudes, orienting the protruding portion of said member between an edge of said tube and said preselected part, heating to a predetermined temperature said preselected part and pressing the protruding portion of said member against said heated preselected part by means of said tube edge to form a bond between said member and said part.

2. The method in accordance with claim 1, which includes the step of increasing the applied pressure beyond that required for bonding to cause said tube edge to shear through said member.

3. The method of bonding a continuous wire-like member to a plurality of preselected parts, which comprises feeding said member through a tube until a portion of said member protrudes, orienting the protruding portion of said member between an edge of said tube and a first one of said preselected parts, heating to a predetermined temperature said parts, pressing the protruding portion of said member against said first heated preselected part by means of said tube edge to form a bond between said member and said part, moving said tube sequentially to the location of each of said remaining heated preselected parts, and repeating the said bonding process at each of said locations.

4. The method of bonding a wire-like member to a preselected part, which comprises feeding said member through a tube until a portion of said member protrudes, bending the protruding portion of said member relative to the axis of said tube at an angle of approximately 90° to orient said portion between an edge of said tube and said preselected part, heating to a predetermined temperature said preselected part, and pressing the protruding portion of said member against said heated preselected part by means of said tube edge to form a bond between said member and said part.

5. The method of bonding a conductive lead to a semiconductive body, which comprises feeding said lead through a tube until a portion of said lead protrudes, orienting the protruding portion of said lead between an edge of said tube and said semiconductive body, heating to a predetermined temperature said semiconductive body, and pressing the protruding portion of said lead against said heated semiconductive body by means of said tube edge to form a bond between said lead and said semiconductive body.

6. The method in accordance with claim 5, in which said conductive lead is bonded to a metallic stripe attached to said semiconductive body.

7. The method of bonding a gold lead to an aluminum stripe formed on a semiconductive body, which comprises feeding said lead through a tube past a tungsten bonding tip fixed to said tube and past a pair of cooperating cutters, actuating said cutters to successively sever said lead and bend said lead substantially perpendicular to the axis of said tube about said bonding tip, deactuating said cutters to remove said cutters away from said lead and tube, heating said semiconductive body to a temperature substantially below the melting point of said lead and stripe, bringing said wire-like member into contact with said stripe, and applying a bonding pressure with said bonding tip to said wire-like member while in contact with said stripe, whereby a thermocompression bond is formed between said lead and said stripe.

8. The method of bonding a metal wire lead to a metal surface of a semiconductive device, which comprises:

feeding a length of metal wire lead through a tube until a portion of said lead protrudes from an end of the tube, moving a cutter against the protruding portion to sever the lead at a point spaced from said end of the tube and to bend the remaining protruding portion across an edge of the tube, heating the metal surface of the semiconductive device to a temperature below the melting point of the lead and the metal surface, bringing the bent portion of the lead into contact with the heated metal surface, and urging the edge of the tube against the bent portion of the lead to apply a bonding pressure to the bent portion and the contacting heated metal surface sufficient to form a bond between the lead and the metal surface.

References Cited in the file of this patent

UNITED STATES PATENTS

| | | |
|---|---|---|
| 1,465,255 | Drosey | Aug. 21, 1923 |
| 2,526,717 | Weisberg | Oct. 24, 1950 |
| 2,606,464 | Fleischer | Aug. 12, 1952 |
| 2,694,249 | Kapp | Nov. 16, 1954 |
| 2,696,656 | Madden | Dec. 14, 1954 |
| 2,848,792 | Reitz | Aug. 26, 1958 |
| 2,862,543 | Kaminsky | Dec. 2, 1958 |